US008674770B2

(12) United States Patent
Takiba et al.

(10) Patent No.: US 8,674,770 B2
(45) Date of Patent: Mar. 18, 2014

(54) TRANSIMPEDANCE AMPLIFIER AND LIGHT RECEIVING CIRCUIT

(75) Inventors: Yukiko Takiba, Fukuoka-ken (JP); Shigeyuki Sakura, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/425,241

(22) Filed: Mar. 20, 2012

(65) Prior Publication Data
US 2013/0063212 A1    Mar. 14, 2013

(30) Foreign Application Priority Data
Sep. 13, 2011    (JP) .................................. 2011-198981

(51) Int. Cl.
*H03F 3/08*    (2006.01)
(52) U.S. Cl.
USPC ......................................................... 330/308
(58) Field of Classification Search
USPC .................. 330/59, 308; 250/214 A, 214 AG
See application file for complete search history.

(56) References Cited

U.S. PATENT DOCUMENTS

| 6,995,615 | B2* | 2/2006 | Zhao ............................. 330/308 |
| 7,265,631 | B2* | 9/2007 | Kwa et al. ..................... 330/308 |
| 7,265,632 | B2* | 9/2007 | Kwa et al. ..................... 330/308 |

FOREIGN PATENT DOCUMENTS

JP    2009-088580    4/2009

* cited by examiner

*Primary Examiner* — Khanh V Nguyen
(74) *Attorney, Agent, or Firm* — Patterson & Sheridan, LLP

(57) ABSTRACT

A transimpedance amplifier includes a first MOS transistor, a current mirror circuit, a second MOS transistor, a load and a first feed back resistor. The first MOS transistor has a gate terminal to which a photodiode is connected. An output current of the first MOS transistor is input to the current mirror. The second MOS transistor has a gate terminal to which a voltage of an output terminal of the current mirror circuit is input. A source of the second MOS transistor is grounded. A polarity of the second MOS transistor is same as a polarity of the first MOS transistor. A first feedback resistor is connected between the gate terminal of the first MOS transistor and a drain terminal of the second MOS transistor. The second MOS transistor outputs a voltage corresponding to the voltage of the output terminal from the drain terminal.

20 Claims, 4 Drawing Sheets

TRANSIMPEDANCE AMPLIFIER AND LIGHT RECEIVING CIRCUIT

CROSS-REFERENCE TO RELATED APPLICATIONS

This application is based upon and claims the benefit of priority from the prior Japanese Patent Application No. 2011-198981, filed on Sep. 13, 2011; the entire contents of which are incorporated herein by reference.

FIELD

Embodiments described herein relate generally to a transimpedance amplifier and a light receiving circuit.

BACKGROUND

Low electrical power consumption while maintaining a broad frequency bandwidth is required of light receiving circuits. If a light receiving circuit is a Metal Oxide Semiconductor (MOS) integrated circuit, these requirements can be satisfied.

Light receiving circuits frequently amplify the photoelectric current of a photodiode using a transimpedance amplifier. In other words, a light receiving device is a photodiode or a phototransistor or the like, and the amplifier is a transimpedance amplifier that is capable of amplifying photoelectric current.

Bipolar transistors and MOS transistors and so on can be used in transimpedance amplifiers. If a MOS transistor is used, it is easier to have low voltage and low current operation.

However, when the power supply voltage of electronic equipment is low voltage, for example, not more than 3 V, there is the problem that if the MOS transistor of the output stage is drain grounded, the output voltage range narrows.

DETAILED DESCRIPTION

In general, according to one embodiment, a transimpedance amplifier includes a first MOS transistor, a current mirror circuit, a second MOS transistor, a load and a first feedback resistor. The first MOS transistor has a gate terminal to which a photodiode is connected. The source of the first MOS transistor is grounded. An output current of the first MOS transistor is input to the current mirror. The second MOS transistor has a gate terminal to which a voltage of an output terminal of the current mirror circuit is input. A source of the second MOS transistor is grounded. A polarity of the second MOS transistor is same as a polarity of the first MOS transistor. A load is connected to the output terminal of the current mirror circuit. A first feedback resistor is connected between the gate terminal of the first MOS transistor and a drain terminal of the second MOS transistor. The second MOS transistor outputs a voltage corresponding to the voltage of the output terminal of the current mirror circuit from the drain terminal.

Hereinafter, embodiments of the present invention will be explained below with reference to the drawings.

Figure 1A:
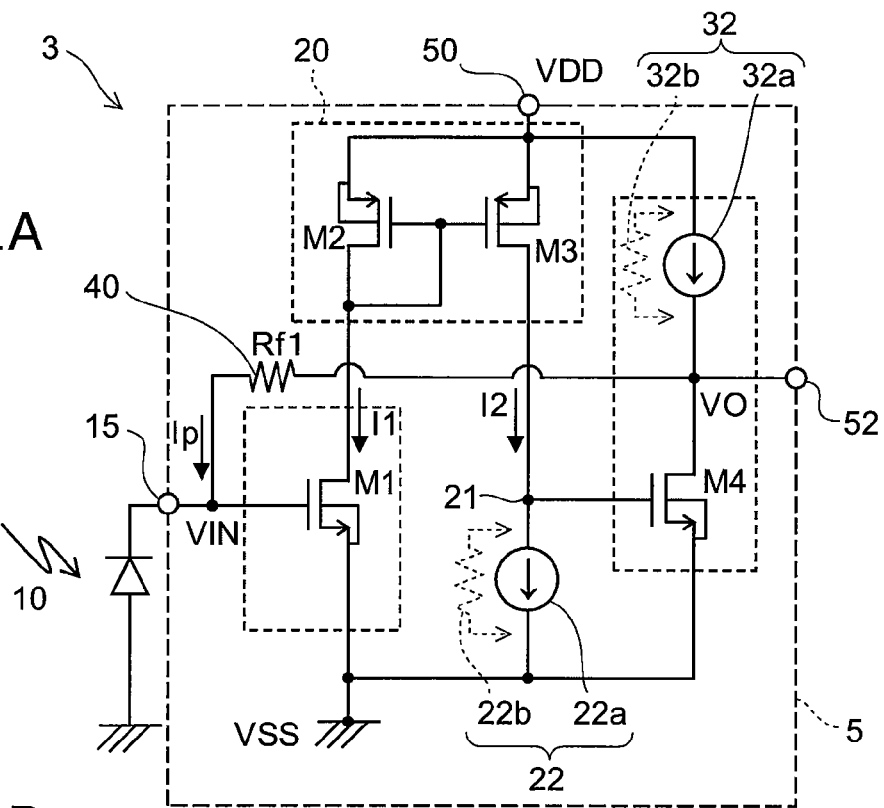
FIG. 1A is a transimpedance amplifier circuit diagram according to a first embodiment.
Figure 1B:
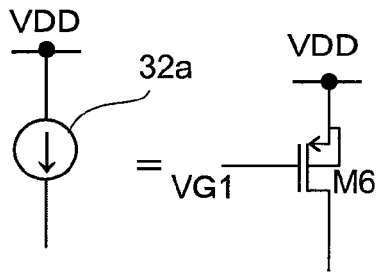
FIG. 1B is a first current source circuit diagram.
Figure 1C:
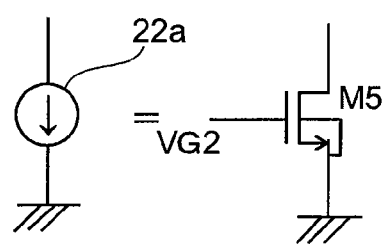
FIG. 1C is a second current source circuit diagram.
Figure 1D:
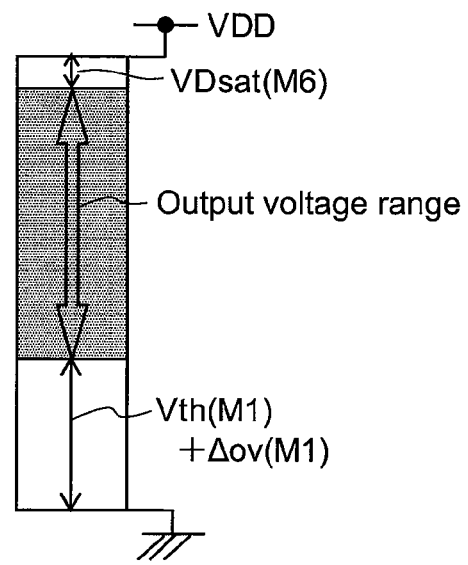
FIG. 1D is a graph showing the output voltage range.

FIG. 1A is a transimpedance amplifier circuit diagram according to a first embodiment, FIG. 1B is a first current source circuit diagram, FIG. 1C is a second current source circuit diagram, and FIG. 1D is a graph showing the output voltage range.

A transimpedance amplifier 5 includes a first MOS transistor M1, a current mirror circuit 20, a load 22, a second MOS transistor M4, a load 32, and a first feedback resistor 40.

An input terminal 15 of the transimpedance amplifier 5 is connected to a gate terminal of the first MOS transistor M1. The input terminal 15 is connected to an externally provided photodiode 10.

The circuit in which the photodiode 10 and the transimpedance amplifier 5 are connected functions as a light receiving circuit 3. The light receiving circuit 3 can be a silicon integrated circuit provided on a substrate made of silicon or the like.

The first MOS transistor M1 and the second MOS transistor M4 are source grounded. The first MOS transistor M1 and the second MOS transistor M4 have the same polarity. Also, in this drawing, each MOS transistor is an N-channel MOS transistor. Alternatively, each MOS transistor may be a P-channel MOS transistor. Also, the first and second MOS transistors M1, M4 can be, for example, enhancement types.

The polarity of MOS transistors that constitute the current mirror circuit 20 is the opposite polarity to that of the first and second MOS transistors M1, M4. In this drawing, these MOS transistors are P-channel MOS transistors M2, M3. The MOS transistors M2, M3 are supplied with a voltage VDD from the power supply via a power supply voltage terminal 50. Also, the first feedback resistor 40 is provided between an output voltage terminal 52 and the input terminal 15.

An output terminal 21 of the current mirror circuit 20 is connected to the load 22 and a gate terminal of the second MOS transistor M4. The load 22 can be a second current source circuit 22a or a resistor 22b or the like. If the size (for example the gate width) of the MOS transistor M3 is different from the size of the MOS transistor M2 that constitute the current mirror circuit 20, it is possible to vary the ratio of the current I2 and the current I1.

The load 32 can be a first current source circuit 32a or a resistor 32b or the like. The first current source circuit 32a includes a P-channel MOS transistor (M6). Also, the load 22 can be the second current source circuit 22a or the resistor 22b or the like. The second current source circuit 22a includes an N-channel MOS transistor (M5). When a positive power supply voltage VDD is applied to the transimpedance amplifier 5, the currents I1, I2 flowing in the current mirror circuit 20, the current flowing in the second MOS transistor M4, the current flowing in the first current source circuit 32a, and the current flowing in the second current source circuit 22a are in equilibrium, so the light receiving circuit 3 is in a steady state condition. In this steady state condition, VIN (voltage at the input terminal)=VO (voltage at the output terminal)=Vth(M1)+Δov(M1).

From this state, if light illuminates the photodiode 10, a photoelectric current Ip flows, produced by generated carriers. The photoelectric current Ip flows through the first feedback resistor 40. As a result, the output voltage VO that is the voltage corresponding to the product of Ip and Rf1 is amplified.

As described above, in the first embodiment, the first MOS transistor M1 operates as an input stage amplifier, and the second MOS transistor M4 operates as an output stage amplifier.

Figure 2:
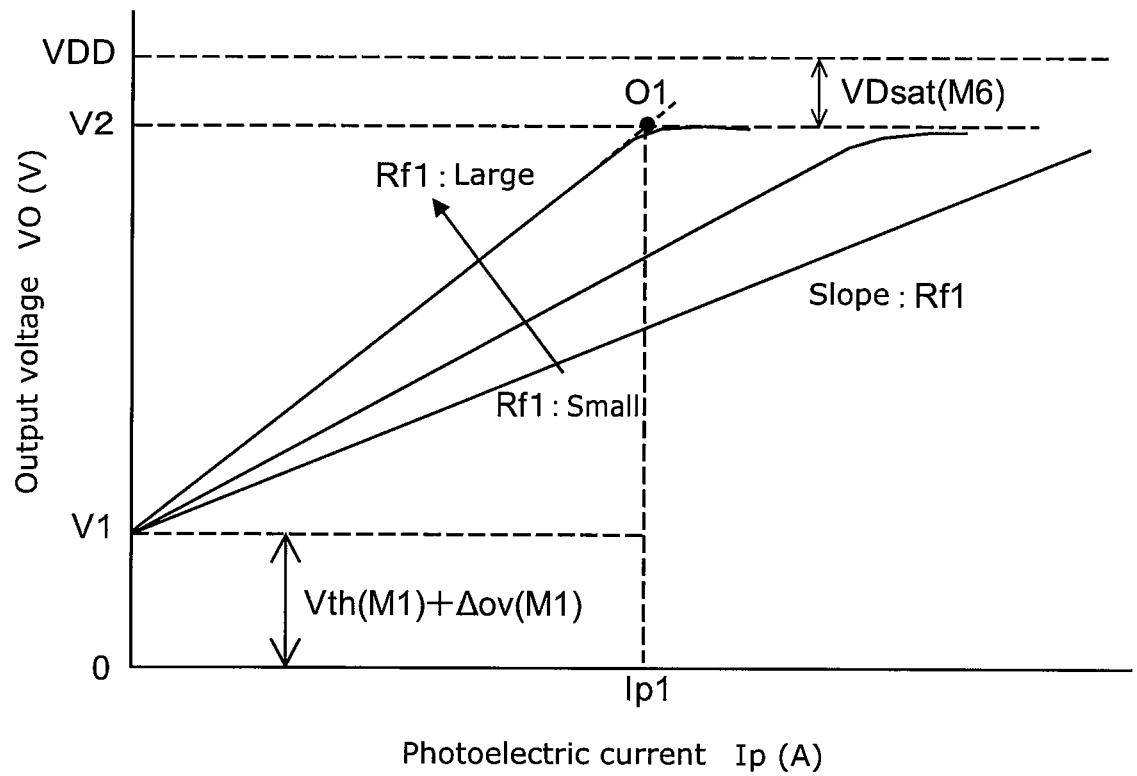
FIG. 2 is a graph showing the dependence of the output voltage on the photoelectric current of the light receiving circuit according to the first embodiment.

FIG. 2 is a graph showing the dependence of the output voltage on the photoelectric current of the light receiving circuit according to the first embodiment.

The vertical axis is the output voltage VO (V) at the output voltage terminal 52, and the horizontal axis is the photoelectric current Ip (A) of the photodiode 10. The photoelectric current Ip increases in accordance with the strength of the incident light, and the output voltage VO starts to increase approximately linearly with respect to the photoelectric current Ip from V1 (=Vth(M1)+Δov(M1)). At this time the value of the resistance Rf1 can be represented as the slope on the graph.

VDsat is the saturated drain voltage (V) of the MOS transistor. In other words, in the case of an N-channel enhancement type, the drain voltage (V) at the transition point from the linear region of MOS transistor operation to the saturated region (dID/dVD is zero) is represented by Equation (1).

$$VDsat = VG - Vth \quad (1)$$

Also, Δov is the overdrive voltage (V), and (Vth+Δov) is applied to the gate terminal.

As the photoelectric current Ip increases, the output voltage VO increases, and finally reaches the maximum voltage V2. When the first current source circuit 32a is the MOS transistor M6, the maximum value V2 (V) is slightly lower than the power supply voltage VDD of the power supply voltage terminal 50, and is given by Equation (2).

$$V2 = VDD - VDsat(M6) \quad (2)$$

That is, maximum value of the voltage output from the drain terminal of the second MOS transistor M4 is the value obtained by subtracting the saturated drain voltage VDsat of the third MOS transistor M6 from the power supply voltage VDD.

Also, the minimum value V1 (V) of the output voltage VO is given by Equation (3).

$$V1 = Vth(M1) + \Delta ov(M1) \quad (3)$$

If the point of intersection of the linear portion that represents the value of the resistance Rf1 and VO=VDsat (M6) is O1 (@Ip=Ip1), then Rf1 is represented by Equation (4).

$$Rf1 = (V2 - V1)/Ip1 \quad (4)$$

If the maximum value of the range of fluctuation of the photoelectric current Ip is Ip1, then using Equation (4) it is possible to determine the target value of the resistance Rf1. In other words, when the maximum value Ip1 of the photoelectric current Ip is large, if Rf1 becomes large, saturation occurs at a photoelectric current value at which the output voltage VO is low with respect to the photoelectric current Ip, so it is difficult to obtain a broad linear output range. Conversely, when the maximum value Ip1 of the photoelectric current Ip is small, if Rf1 becomes small, the output voltage VO does not saturate with respect to the photoelectric current Ip, and the output voltage VO does not rise as high as VDsat (M6). If the resistance Rf1 has a value close to Equation (4), it is possible to obtain a broad output voltage range.

The MOS transistors (M1, M2, M3, M4, M5, M6) are made of silicon, and are enhancement types. In this case, for example, Vth=0.8 V, Δov=0.2 V, VDsat=0.2 V, or the like. For example, if VDD=3 V, then V1=1.0 V, V2=2.8 V, and the output voltage range (V2-V1) can be broadened to 1.8 V.

In FIGS. 1A, 1B, 1C, and 1D, the conductivity types of the photodiode 10 and the MOS transistors (M1, M2, M3, M4, M5, M6) may all be the opposite conductivity types.

If the MOS transistors are bipolar transistors, for example source grounded circuits may be replaced with emitter grounded circuits. However, MOS transistors have low voltage and low current operation, so it is easier to obtain a wider output voltage range.

Also, in the case of a MOS transistor, by shortening the gate length, it is easy to raise the upper limit of frequency that can be amplified to, for example, 100 MHz or higher.

Figure 3A:
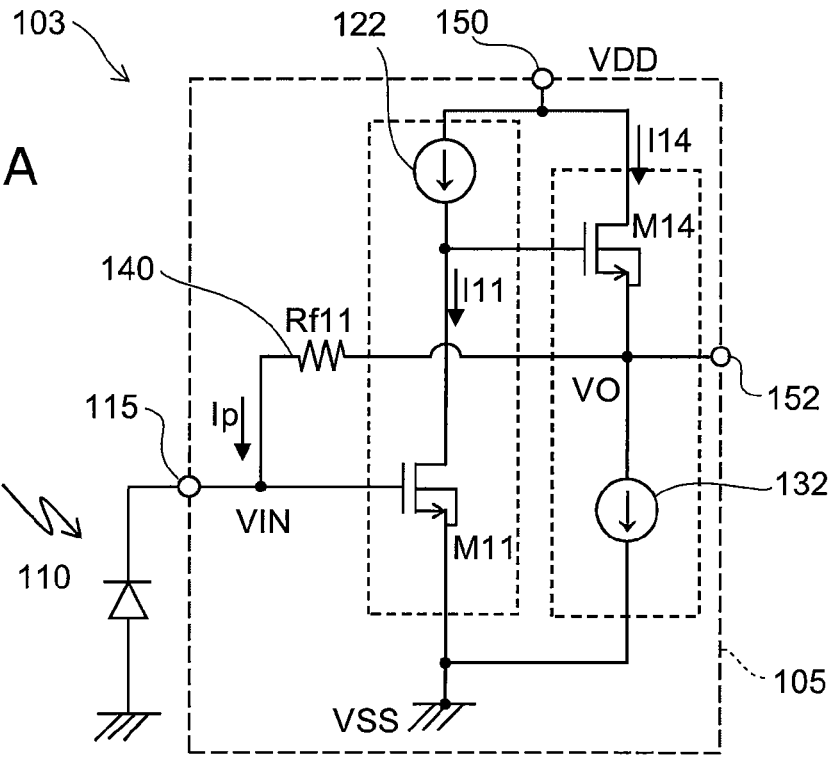
FIG. 3A is a transimpedance amplifier circuit diagram according to a comparative example.
Figure 3B:
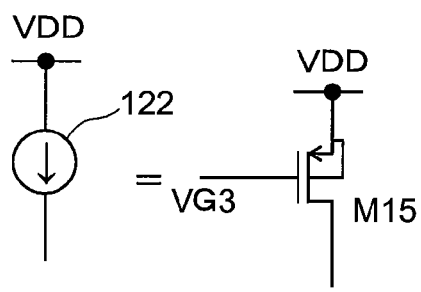
FIG. 3B is a first current source circuit diagram.
Figure 3C:
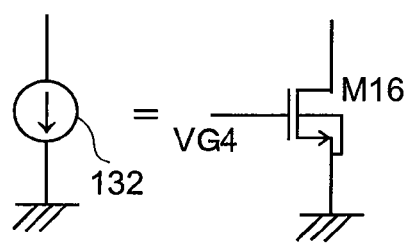
FIG. 3C is a second current source circuit diagram.
Figure 3D:
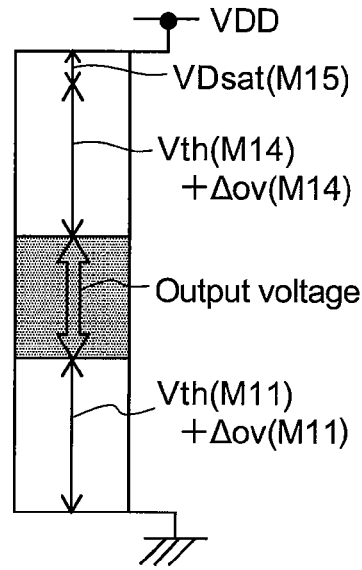
FIG. 3D is a graph showing the output voltage range.

FIG. 3A is a transimpedance amplifier circuit diagram according to a comparative example, FIG. 3B is a first current source circuit diagram, FIG. 3C is a second current source circuit diagram, and FIG. 3D is a graph showing the output voltage range.

A transimpedance amplifier 105 includes a first MOS transistor M11, a first current source circuit 122, a second MOS transistor M14, a second current source circuit 132, and a feedback resistor 140.

The first MOS transistor M11 is a source grounded N-channel type. A gate terminal of the first MOS transistor M11 is connected to a photodiode 110. Carriers generated by irradiation with incident light such as visible light or the like pass through the reverse biased photodiode 110 producing the photoelectric current Ip.

If the second MOS transistor M14 is a drain grounded (common drain) type as in FIG. 3A, an additional voltage between the drain and the source is required to operate the second MOS transistor M14. Therefore the voltage range that can be obtained for the output voltage VO of an output voltage terminal 152 is reduced.

Figure 4:
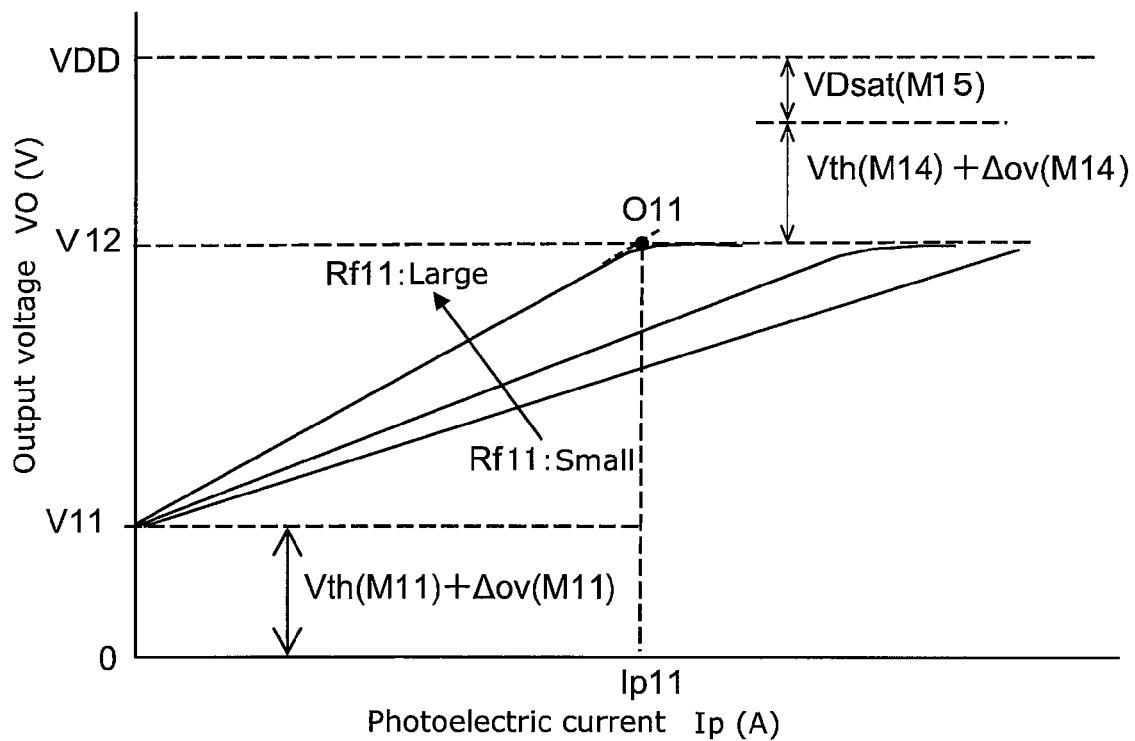
FIG. 4 is a graph showing the dependence of the output voltage VO on the photoelectric current Ip in the comparative example.

FIG. 4 is a graph showing the dependence of the output voltage VO on the photoelectric current Ip in the comparative example.

In the comparative example, the value of the resistance Rf11 can be represented as the slope on the graph. Also, the maximum value V12 of the output voltage VO is represented by Equation (5).

$$V12 = VDD - [Vth(M14) + \Delta ov(M14)] - VDsat(M15) \quad (5)$$

In addition, the minimum value V11 (V) of the output voltage VO is represented by Equation (6).

$$V11 = Vth(M11) + \Delta ov(M11) \quad (6)$$

If the point of intersection of the linear portion that represents the value of the resistance Rf11 and V12 is O11 (Ip=Ip11), then Rf11 is represented by Equation (7).

$$Rf11 = (V12 - V11)/Ip11 \quad (7)$$

The first current source circuit 122 can be a P-channel MOS transistor with the gate voltage VG3 appropriately controlled. The second current source circuit 132 can be an N-channel MOS transistor with the gate voltage VG4 appropriately controlled.

The MOS transistors (M11, M14, M15, M16) are made from silicon, and are enhancement types. In this case, for example, Vth=0.8 V, Δov=0.2 V, VDsat=0.2 V, or the like. If VDD=3 V, then V11=1.0 V and V12=1.8 V, and the output voltage range (V12-V11) is 0.8 V, which is narrower than that of the first embodiment.

In FIG. 3A, the back gate of the MOS transistor M14 is connected to the source potential, but if it is only possible to connect the back gate to the ground potential due to the structure of the device, Vth (M14) increases, so the output voltage range is further narrowed.

Figure 5:
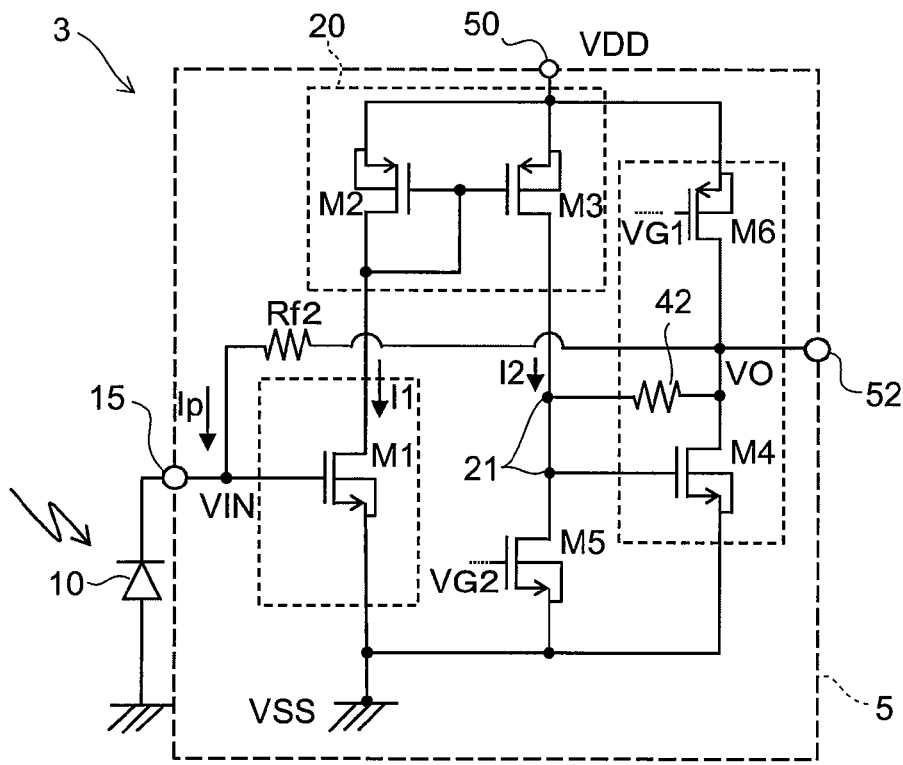
FIG. 5 is a transimpedance amplifier circuit diagram according to a second embodiment.

FIG. 5 is a transimpedance amplifier circuit diagram according to a second embodiment.

In this embodiment, the load of the current mirror circuit 20 is represented as a current source circuit using a MOS transistor M5. Also, a current source circuit using a MOS transistor M6 is provided between the drain terminal of the second MOS transistor M4 and the power supply voltage terminal 50. Also, in the second embodiment, a second feedback resistor 42 is provided between the gate terminal and the drain terminal of the second MOS transistor M4. Using the second feedback resistor 42 it is possible to widen the bandwidth of the transimpedance amplifier 5.

The transimpedance amplifier 5 according to the first and second embodiments and the light receiving circuit 3 using this transimpedance amplifier 5 can be widely used in optical sensors, optical couplers, optical pick ups, optical link modules, and so on. As a result, these devices can operate with power supply voltage of 3 V or less, so it is easy to reduce the electrical power consumption.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiment described herein may be made without departing from the spirit of the inventions. The accompanying claims and their equivalents are intended to cover such forms or modifications as would fall within the scope and spirit of the inventions.

What is claimed is:

1. A transimpedance amplifier, comprising:
    a first MOS transistor having a gate terminal to which a photodiode is connected, a source terminal of the first MOS transistor being grounded;
    a current mirror circuit to which an output current of the first MOS transistor is input, the current mirror circuit including MOS transistors each having a polarity opposite to a polarity of the first MOS transistor;
    a second MOS transistor having a gate terminal to which a voltage of an output terminal of the current mirror circuit is input, a source terminal of the second MOS transistor being grounded, a polarity of the second MOS transistor being the same as the polarity of the first MOS transistor;
    a load connected to the output terminal of the current mirror circuit; and
    a first feedback resistor connected between the gate terminal of the first MOS transistor and a drain terminal of the second MOS transistor,
    the second MOS transistor outputting a voltage corresponding to the voltage of the output terminal of the current mirror circuit from the drain terminal.

2. The transimpedance amplifier of claim 1, further comprising a power supply voltage terminal, and
    a current source circuit provided between the power supply voltage terminal and the drain terminal of the second MOS transistor.

3. The transimpedance amplifier according to claim 2, wherein the current source circuit includes a third MOS transistor having a polarity opposite to the polarity of the first MOS transistor, wherein
    a source terminal of the third MOS transistor is connected to the power supply voltage terminal side, and
    maximum value of the voltage output from the drain terminal of the second MOS transistor is a value obtained by subtracting the saturated drain voltage of the third MOS transistor from the power supply voltage.

4. The transimpedance amplifier according to claim 1, further comprising a power supply voltage terminal, and
    a resistor provided between the power supply voltage terminal and the drain terminal of the second MOS transistor.

5. The transimpedance amplifier according to claim 1, wherein the load is a current source circuit.

6. The transimpedance amplifier according to claim 5, wherein the current source circuit includes a MOS transistor having the same polarity as the polarity of the first MOS transistor.

7. The transimpedance amplifier according to claim 1, wherein the load is a resistor.

8. The transimpedance amplifier according to claim 1, wherein the first MOS transistor and the second MOS transistor are N-channel MOS transistors.

9. The transimpedance amplifier of claim 1, wherein the first MOS transistor is a N-channel transistor and the MOS transistors included in the current mirror circuit are P-channel transistors.

10. A transimpedance amplifier, comprising:
    a first MOS transistor having a gate terminal to which a photodiode is connected, a source of the first MOS transistor being grounded;
    a current mirror circuit to which an output current of the first MOS transistor is input;
    a second MOS transistor having a gate terminal to which a voltage of an output terminal of the current mirror circuit is input, a source of the second MOS transistor being grounded, a polarity of the second MOS transistor being same as a polarity of the first MOS transistor;
    a load connected to the output terminal of the current mirror circuit;
    a first feedback resistor connected between the gate terminal of the first MOS transistor and a drain terminal of the second MOS transistor; and
    a second feedback resistor connected between the drain terminal of the second MOS transistor and the gate terminal of the second MOS transistor, the second MOS transistor outputting a voltage corresponding to the voltage of the output terminal of the current mirror circuit from the drain terminal.

11. The transimpedance amplifier according to claim 10, further comprising a power supply voltage terminal, and
    a current source circuit provided between the power supply voltage terminal and the drain terminal of the second MOS transistor.

12. The transimpedance amplifier according to claim 11, wherein the current source circuit includes a third MOS transistor having a polarity opposite to the polarity of the first MOS transistor,
    a source terminal of the third MOS transistor is connected to the power supply voltage terminal side, and
    maximum value of the voltage output from the drain terminal of the second MOS transistor is a value obtained by subtracting the saturated drain voltage of the third MOS transistor from the power supply voltage.

13. The transimpedance amplifier according to claim 10, further comprising a power supply voltage terminal, and
a resistor provided between the power supply voltage terminal and the drain terminal of the second MOS transistor.

14. The transimpedance amplifier according to claim 10, wherein the load is a current source circuit.

15. The transimpedance amplifier according to claim 14, wherein the current source circuit includes a MOS transistor having the same polarity as the polarity of the first MOS transistor.

16. The transimpedance amplifier according to claim 10, wherein the load is a resistor.

17. The transimpedance amplifier according to claim 10, wherein the first MOS transistor and the second MOS transistor are N-channel MOS transistors.

18. A light receiving circuit, comprising:
a photodiode;
a first MOS transistor having a gate terminal to which the photodiode is connected, a source terminal of the first MOS transistor being grounded;
a current mirror circuit to which an output current of the first MOS transistor is input, the current mirror circuit including MOS transistors each having a polarity opposite to a polarity of the first MOS transistor;
a second MOS transistor having a gate terminal to which a voltage of an output terminal of the current mirror circuit is input, a source terminal of the second MOS transistor being grounded, a polarity of the second MOS transistor being same as the polarity of the first MOS transistor;
a load connected to the output terminal of the current mirror circuit; and
a first feedback resistor connected between the gate terminal of the first MOS transistor and a drain terminal of the second MOS transistor,
the second MOS transistor outputting a voltage corresponding to the output current of the photodiode from the drain terminal.

19. The light receiving circuit according to claim 18, further comprising a second feedback resistor connected between the drain terminal of the second MOS transistor and the gate terminal of the second MOS transistor.

20. The light receiving circuit of claim 18, wherein the first MOS transistor is a N-channel transistor and the MOS transistors included in the current mirror circuit are P-channel transistors.

* * * * *